(12) United States Patent
Gopalakrishnan (10) Patent No.: US 8,169,820 B2
(45) Date of Patent: *May 1, 2012

(54) USE OF SYMMETRIC RESISTIVE MEMORY MATERIAL AS A DIODE TO DRIVE SYMMETRIC OR ASYMMETRIC RESISTIVE MEMORY

(75) Inventor: Kailash Gopalakrishnan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/035,100

(22) Filed: Feb. 25, 2011

(65) Prior Publication Data

US 2011/0141801 A1 Jun. 16, 2011

Related U.S. Application Data

(63) Continuation of application No. 11/761,043, filed on Jun. 11, 2007, now Pat. No. 7,929,335.

(51) Int. Cl.
*G11C 11/00* (2006.01)
(52) U.S. Cl. ......................... 365/163; 365/100
(58) Field of Classification Search .................. 365/163, 365/100
See application file for complete search history.

(56) References Cited

U.S. PATENT DOCUMENTS

| | | | |
|---|---|---|---|
| 4,795,657 A | 1/1989 | Formigoni et al. | |
| 5,544,104 A * | 8/1996 | Chauvel | 365/189.15 |
| 6,574,129 B1 | 6/2003 | Tran | |
| 6,633,497 B2 | 10/2003 | Nickel | |
| 6,670,824 B2 | 12/2003 | Goodbread et al. | |
| 6,678,189 B2 | 1/2004 | Tran | |
| 6,754,097 B2 | 6/2004 | Sharma et al. | |
| 6,754,123 B2 | 6/2004 | Perner et al. | |
| 6,778,426 B2 | 8/2004 | Hosotani | |
| 6,855,975 B2 | 2/2005 | Gilton | |
| 6,885,573 B2 | 4/2005 | Sharma et al. | |
| 6,980,463 B2 | 12/2005 | Hosotani et al. | |
| 6,987,689 B2 | 1/2006 | Bozano et al. | |
| 7,031,185 B2 | 4/2006 | Perner et al. | |
| 7,034,332 B2 | 4/2006 | Stasiak et al. | |
| 7,042,757 B2 | 5/2006 | Perner | |
| 7,046,546 B1 | 5/2006 | Inaba | |
| 7,057,923 B2 | 6/2006 | Furkay et al. | |
| 7,224,598 B2 | 5/2007 | Perner | |
| 7,382,647 B1 | 6/2008 | Gopalakrishnan | |
| 2006/0067112 A1 | 3/2006 | Ferrant et al. | |

OTHER PUBLICATIONS

Kund et al., "Conductive Bridging RAM (CBRAM): An Emerging Non-Volatile Memory Technology Scalable to Sub 20nm," IEEE 0-7803-9269, Aug. 2005, 4pgs.

* cited by examiner

*Primary Examiner* — Son Dinh
*Assistant Examiner* — Nam Nguyen
(74) *Attorney, Agent, or Firm* — IP Authority, LLC; Ramraj Soundararajan (57) ABSTRACT

A crosspoint array is made up of a plurality of bitlines and wordlines and a plurality of crossbar elements, with each crossbar element being disposed between a bitline and a wordline, and each crossbar element comprising at least a phase change material used as a rectifier in series with a solid electrolyte used as an asymmetric resistive memory element. The crossbar elements are responsive to the following voltages: a first set of voltages to transition the phase change material in the crossbar elements from an OFF state to an ON state; a second set of voltages to read or program the solid electrolyte, and a third set of voltages to transition the phase change material from an ON state to an OFF state.

18 Claims, 5 Drawing Sheets

USE OF SYMMETRIC RESISTIVE MEMORY MATERIAL AS A DIODE TO DRIVE SYMMETRIC OR ASYMMETRIC RESISTIVE MEMORY

RELATED APPLICATIONS

This application is a continuation of pending U.S. application Ser. No. 11/761,043 filed Jun. 11, 2007.

BACKGROUND OF THE INVENTION

1. Field of Invention

The present invention relates generally to memory technology. More generally, it relates to the use of symmetric resistive memory materials and devices for use as diodes for driving symmetric and asymmetric resistive memory elements. More specifically, the present invention is related to the use of a symmetric programmable material, such as phase change material (PCMA), as a diode for driving asymmetric programmable memory materials, such as solid electrolyte (SE) memories, or symmetric programmable memory materials, such as phase change memories (PCM), in a crosspoint array architecture. Device structures, material options, voltage sequences, etc. for symmetric programmable material (such as phase change material (PCMA)) needed for rectification of symmetric or asymmetric memory materials are described.

2. Discussion of Prior Art

The following references provide a general teaching of crosspoint arrays.

The U.S. patent to Hosotani et al. (U.S. Pat. No. 6,980,463) teaches a semiconductor memory device that has a structure using a rectifying element (e.g., a p-n junction diode) as a switching element connected to a Tunneling Magneto Resistive (TMR) element, wherein the described structure is a simple one capable of realizing a crosspoint cell.

The U.S. patent to Tsuneo Inaba (U.S. Pat. No. 7,046,546 B1) teaches a crosspoint memory cell with a memory device and a read switching element which may be a rectifying element.

The U.S. patent to Bozano et al. (U.S. Pat. No. 6,987,689 B2) teaches the possibility of achieving intrinsic rectification in a crosspoint memory element by the suitable choice of electrode materials.

The U.S. patent to Stasiak et al. (U.S. Pat. No. 7,034,332 B2) teaches a memory device including a substrate and multiple self-aligned nano-rectifying elements disposed over the substrate, wherein each nano-rectifying element has multiple first electrode lines, and multiple device structures are disposed on the multiple first electrode lines forming the multiple self-aligned nano-rectifying elements. According to Stasiak's design, the switching elements are made of phase change material.

The U.S. patent to Keiji Hosotani (U.S. Pat. No. 6,778,426 B2) teaches a magnetic random access memory (MRAM) using a phase change memory element instead of a tunneling magneto resistive (TMR) element.

The U.S. patent to Formigoni et al. (U.S. Pat. No. 4,795,657) teaches a memory cell with a rectifying element and a memory element.

The U.S. patent to Terry L. Gilton (U.S. Pat. No. 6,855,975 B2) teaches an integrated programmable conductor memory cell and diode device in an integrated circuit comprising a diode and a glass electrolyte element, the glass electrolyte element having metal ions mixed or dissolved therein and being able to selectively form a conductive pathway under the influence of an applied voltage. In one embodiment of Gilton's patent, both the diode and the memory cell comprise a chalcogenide glass, such as germanium selenide (e.g., $Ge_2Se_8$ or $Ge_{25}Se_{75}$). In this embodiment of the Gilton patent, the first diode element comprises a chalcogenide glass layer having a first conductivity type, the second diode element comprises a chalcogenide glass layer doped with an element such as bismuth and having a second conductivity type opposite to the first conductivity type, and the memory cell comprises a chalcogenide glass element with silver ions therein.

The U.S. patent to Frederick A. Perner (U.S. Pat. No. 7,042,757) provides a 1R1D block architecture magnetic memory device. The Perner reference relates to magnetic memory devices, and in particular, relates to cross-point resistive devices such as magnetic random access memory arrays (MRAMs). By incorporating PN diodes, the effective size of the cross-point array may be increased beyond the traditional 1,000 columns by 1,000 rows.

The U.S. patent to Perner et al. (U.S. Pat. No. 7,031,185) teaches a resistive cross point memory cell array comprising a plurality of word lines, a plurality of bit lines, a plurality of cross points formed by the word lines and the bit lines, and a plurality of memory cells, each of the memory cells being located at a different one of the cross points, wherein a first bit line comprises a distributed series diode along an entire length of the bit line such that each of the associated memory cells located along the first bit line is coupled between the distributed series diode and an associated word line.

The U.S. patent to Sharma et al. (U.S. Pat. No. 6,885,573) teaches a diode for use in MRAM devices and method of manufacture of such a device. Sharma et al. teach a data storage device that has a plurality of word lines, a plurality of bit lines, and a resistive crosspoint array of memory cells. Each memory cell is connected to a bit line and connected to an isolation diode that further connects to a respective word line. The isolation diode provides a unidirectional conductive path from the bit line to the word line. Each word line provides a common metal-semiconductor contact with each diode sharing the word line such that each diode has a separate metal contact located between the semiconductor portion of the common metal-semiconductor contact and its respective memory cell. Sharma et al.'s MRAM device has improved unidirectional elements to limit leakage current within the array.

The U.S. patent to Sharma et al. (U.S. Pat. No. 6,754,097) teaches magnetoresistive devices or memory elements of a phase-change material, which are connected as a crosspoint network, wherein blocking devices such as diodes or transistors may be connected to the magnetoresistive devices.

The U.S. patent to Lung Tran (U.S. Pat. No. 6,678,189) teaches memory cell elements which may include thin film memory elements such as polymer memory elements, magnetic tunnel junctions (the SDT junction is a type of magnetic tunnel junction), or phase change devices. Each memory cell is limited in providing a conductive path in a first direction only by way of a unidirectional element, wherein such unidirectional elements could have diodes.

The U.S. patent to Goodbread et al. (U.S. Pat. No. 6,670,824) teaches an integrated polysilicon fuse and diode and methods of making the same. The integrated polysilicon fuse and diode combination may be implemented in a programmable crosspoint fuse array. The integrated polysilicon fuse and diode may be used in a random access memory (RAM) cell.

The U.S. Pre-Grant Publication to Ferrant et al. (2006/0067112 A1) teaches resistive memory cells (which can be brought into two or more states exhibiting different electrical resistance values), such as magneto-resistive memory cells including magnetic tunnel junctions as used in conventional MRAMs, phase change memory cells using some sort of a phase change material, and conductive bridging memory cells using some sort of a solid state electrolyte in combination with an ion donor electrode using a independent-gated FINFET architecture.

Whatever the precise merits, features, and advantages of the above cited references, none of them achieves or fulfills the purposes of the present invention.

SUMMARY OF THE INVENTION

The present invention provides for a crosspoint array comprising: a plurality of bitlines and wordlines; and a plurality of crossbar elements, each crossbar element disposed between a bitline and a wordline and each crossbar element comprising at least a phase change material used as a rectifier in series with a solid electrolyte used as an asymmetric resistive memory element, where one or more of the crossbar elements are responsive to the following voltages: a first set of voltages to transition the phase change material in the crossbar elements from an OFF state to an ON state; a second set of voltages to read or program the solid electrolyte, and a third set of voltages to transition the phase change material from an ON state to an OFF state.

The present invention also provides for a method for use with a crosspoint array, the crosspoint array comprising a plurality of bitlines and wordlines and a plurality of crossbar elements, each crossbar element disposed between a bitline and a wordline, each crossbar element comprising at least a phase change material used as a rectifier in series with a solid electrolyte, the method comprising the steps of: applying a first set of voltages to at least one of the crossbar elements, the first set of voltages transitioning the phase change material in the crossbar elements from an OFF state to an ON state; applying a second set of voltages to at least one of the crossbar elements, the second set of voltages reading or programming the solid electrolyte, and applying a third set of voltages to at least one of the crossbar elements, the third set of voltages transitioning the phase change material from an ON state to an OFF state.

According to one embodiment of the present invention, the solid electrolyte memory includes at least one of following: germanium sulfide ($Ge_xS_{1-x}$), germanium selenide ($Ge_xSe_{1-x}$), germanium telluride ($Ge_xTe_{1-x}$), silicon sulfide ($Si_xS_{1-x}$), silicon selenide ($Si_xSe_{1-x}$), silicon telluride ($Si_xTe_{1-x}$), arsenic sulfide ($As_xS_{1-x}$), arsenic selenide ($As_xSe_{1-x}$), arsenic telluride ($As_xTe_{1-x}$), lead sulfide ($Pb_xS_{1-x}$), lead selenide ($Pb_xSe_{1-x}$), lead telluride ($Pb_xTe_{1-x}$), cadmium sulfide ($Cd_xS_{1-x}$), cadmium selenide ($Cd_xSe_{1-x}$), cadmium telluride ($Cd_xTe_{1-x}$), zinc sulfide ($Zn_xS_{1-x}$), zinc selenide ($Zn_xSe_{1-x}$), zinc telluride ($Zn_xTe_{1-x}$), silver sulfide ($Ag_xS$), silver selenide ($Ag_xSe$), copper sulfide ($Cu_xS$), copper selenide ($Cu_xSe$), tungsten oxide ($WO_x$), copper oxide ($Cu_xO$), silver (Ag), copper (Cu), lithium (Li), sodium (Na), and zinc (Zn).

According to one embodiment of the present invention, the crosspoint architecture is a three-dimensional structure comprising multiple layers of memory cells in a chip, wherein the architecture comprises a plurality of layers, with wordlines and bitlines in each layer running at lithographic pitches, and the effective density of cells is $4F^2/n$, where 2F is a lithographic pitch and n is the number of layers.

According to one embodiment of the present invention, the symmetric or substantially resistive memory material used as a rectifier, in said ON state has a first resistance, $R_{ON}$, and in an OFF state has a second resistance, $R_{OFF}$, with $R_{OFF}/R_{ON} \geq 10^4$.

The present invention also provides for a crosspoint array comprising: a plurality of bitlines and wordlines; and a plurality of crossbar elements, each crossbar element disposed between a bitline and a wordline and each crossbar element comprising at least a phase change material used as a rectifier in series with a solid electrolyte used as an asymmetric resistive memory element, the solid electrolyte material comprising either a combination of germanium sulfide ($Ge_xS_{1-x}$) and silver (Ag) or a combination of germanium sulfide ($Ge_xS_{1-x}$) and copper (Cu), and the phase change material, in the ON state has a first resistance, $R_{ON}$, and in an OFF state has a second resistance, $R_{OFF}$, with $R_{OFF}/R_{ON} \geq 10^4$, where one or more of the crossbar elements are responsive to the following voltages: a first set of voltages to transition the phase change material in the crossbar elements from an OFF state to an ON state; a second set of voltages to read or program the solid electrolyte, and a third set of voltages to transition the phase change material from an ON state to an OFF state.

DESCRIPTION OF THE PREFERRED EMBODIMENTS

While this invention is illustrated and described with respect to preferred embodiments, the invention may be produced in many different configurations. There is depicted in the drawings, and will herein be described in detail, preferred embodiments of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

This present invention solves an important problem related to ultra high density memory technologies. The densest form of memory technology that can be fabricated is a crossbar memory which is made of sets of perpendicularly oriented, lithographically defined conducting lines and a memory element (ME) and diode situated at the intersection of any 2 perpendicularly oriented lines. This density can be further increased by having many such layers of perpendicularly oriented lines in a 3D configuration or by having these perpendicular lines at sublithographic pitches (fabricated using nanoimprint lithography, for example). In any of these approaches, the memory element may be an element such as solid electrolyte memory, phase change memory, some form of magnetoresistive random access memory (MRAM), ferroelectric random access memory (FeRAM), organic resistive memory, complex metal oxide memories, oxide-resistive memories, perovskite memory, memories that change some electrical property when a current flows through them, etc.

Most memory elements including the ones listed above need very high current densities for programming—especially as the memory element is shrunk down to deep submicron dimensions. The major function of the diode (in series with the memory element at the crosspoint) is to turn off many of the other memory elements in the array—so that these elements don't interfere with the program/read/erase (P/R/E) operation of the selected memory element. In addition, the diode has to be able to supply enough current required by the memory element for its P/R/E operation. Typical current densities required for these memory elements range from $10^6$ to $10^8$ A/cm$^2$. The best known silicon p-n junctions can supply currents with not much higher than $10^6$ A/cm$^2$ densities at reasonable voltages (the current density in polycrystalline p-n junctions is even lower). This raises the need for a new diode element that can be used with bi-directional memory elements, such as the ones listed above and which can supply ultra-high current densities.

The present invention uses a symmetric resistive memory material, such as phase change material (PCMA), as a diode for driving asymmetric programmable memory materials, such as solid electrolyte (SE) memories, or symmetric programmable memory materials, such as phase change memories (PCM), in a crosspoint array architecture.

Although particular examples described in the specification and illustrated in the examples outline the use of PCMA, it should be noted that any symmetric resistive memory element could be substituted as the diode. The PCMA is engineered to have a very high resistance in the OFF state and a very low resistance in the ON state, thereby yielding a very high ON/OFF ratio which makes it a nearly ideal diode. During the passage of current (during P/R/E) of the memory element, the PCMA may also program into the low resistance state. In order for the diode functionality to work, the final state of the PCMA must be the high resistance state. Therefore, each P/R/E operation of the asymmetric memory element (e.g., SE) or symmetric memory element (e.g., PCM) has to be followed by erasure of the PCMA. This can be accomplished using one of the following:

(a) If the PCMA set current is less than the peak programming current (i.e., the peak programming current required for P/R/E), then the PCMA will not be set when it goes through a threshold switching process. Thus, after an ME P/R/E, the PCMA will automatically return to its high-resistance OFF state value.

(b) If the PCMA is at a low resistance state, then an additional pulse is applied to put it back in the high resistance state (Reset) after the ME P/E operation. In this case, for asymmetrically programmed memory elements, the PCMA is reverted into its high resistance state by applying a pulse with the same polarity as the program pulse but with a different amplitude and pulse width.

The present invention uses a symmetric resistive memory material, such as phase change material (PCMA), as a diode for driving asymmetric programmable memory materials, such as solid electrolyte (SE) memories, or symmetric programmable memory materials, such as phase change memories (PCM), in a crosspoint array architecture. The present invention addresses some of the possible device structure options and some of the possible voltage sequences for successful array operation. The present invention also addresses possible array configurations.

Examples of SE memory material include, but are not limited to: germanium sulfide ($Ge_xS_{1-x}$), germanium selenide ($Ge_xSe_{1-x}$), germanium telluride ($Ge_xTe_{1-x}$), silicon sulfide ($Si_xS_{1-x}$), silicon selenide ($Si_xSe_{1-x}$), silicon telluride ($Si_xTe_{1-x}$), arsenic sulfide ($As_xS_{1-x}$), arsenic selenide ($As_xSe_{1-x}$), arsenic telluride ($As_xTe_{1-x}$), lead sulfide ($Pb_xS_{1-x}$), lead selenide ($Pb_xSe_{1-x}$), lead telluride ($Pb_xTe_{1-x}$), cadmium sulfide ($Cd_xS_{1-x}$), cadmium selenide ($Cd_xSe_{1-x}$), cadmium telluride ($Cd_xTe_{1-x}$), zinc sulfide ($Zn_xS_{1-x}$), zinc selenide ($Zn_xSe_{1-x}$), zinc telluride ($Zn_xTe_{1-x}$), silver sulfide ($Ag_xS$), silver selenide ($Ag_xSe$), copper sulfide ($Cu_xS$), copper selenide ($Cu_xSe$), tungsten oxide ($WO_x$), copper oxide ($Cu_xO$), silver (Ag), copper (Cu), lithium (Li), sodium (Na), and zinc (Zn), and combinations of the materials thereof.

Although throughout the specification, a generic symmetric memory technology has been used as an example, it should be noted that the teachings of the present invention can also be applied in other cases pertaining to substantially symmetric memory elements and in applications such as, but not limited to, Field Programmable Gate Array (FPGA), embedded microcontrollers, hard-disk drives, and devices for space applications.

In order to increase the density of memory technologies (both volatile and nonvolatile), a crosspoint design is preferred. In such an optimized design, the wordline and bitlines (henceforth referred to as memory lines) run at minimum possible pitch. A storage element is placed at the sandwich of these perpendicularly oriented lines. Two possible designs exist:

(a) A Nano-Crossbar Design—where the memory lines run at sublithographic pitches. This decreases memory cell area from $4F^2$ to $4Fs^2$ where 2Fs is the nanoscale pitch. Typically Fs<<F where 2F is the lithographic pitch.

(b) A 3D Design—where the memory lines run at lithographic pitches but multiple layers of these memories are formed. The effective density of these cells is therefore $4F^2/n$ where n is the number of 3D layers (n>=1).

In both cases above, at the intersection of the memory lines, two device components are needed:

(a) A memory element that is used to store data/information. Many options exist here and include most asymmetric resistive memory elements. It should be noted that both asymmetric programmable memory element, such as SE, and symmetric programmable memory element, such as PCM, can be used as the memory element. However, it should also be noted that the preferred memory element of choice is an asymmetric programmable memory element, such as SE.

(b) Since a transistor is not present at every crosspoint, a selection device is needed that shows rectification properties or, in general, exhibits non-linearity. This ensures that cells that lie on unselected wordlines and bitlines are not inadvertently programmed or shorted to each other.

Figure 1:
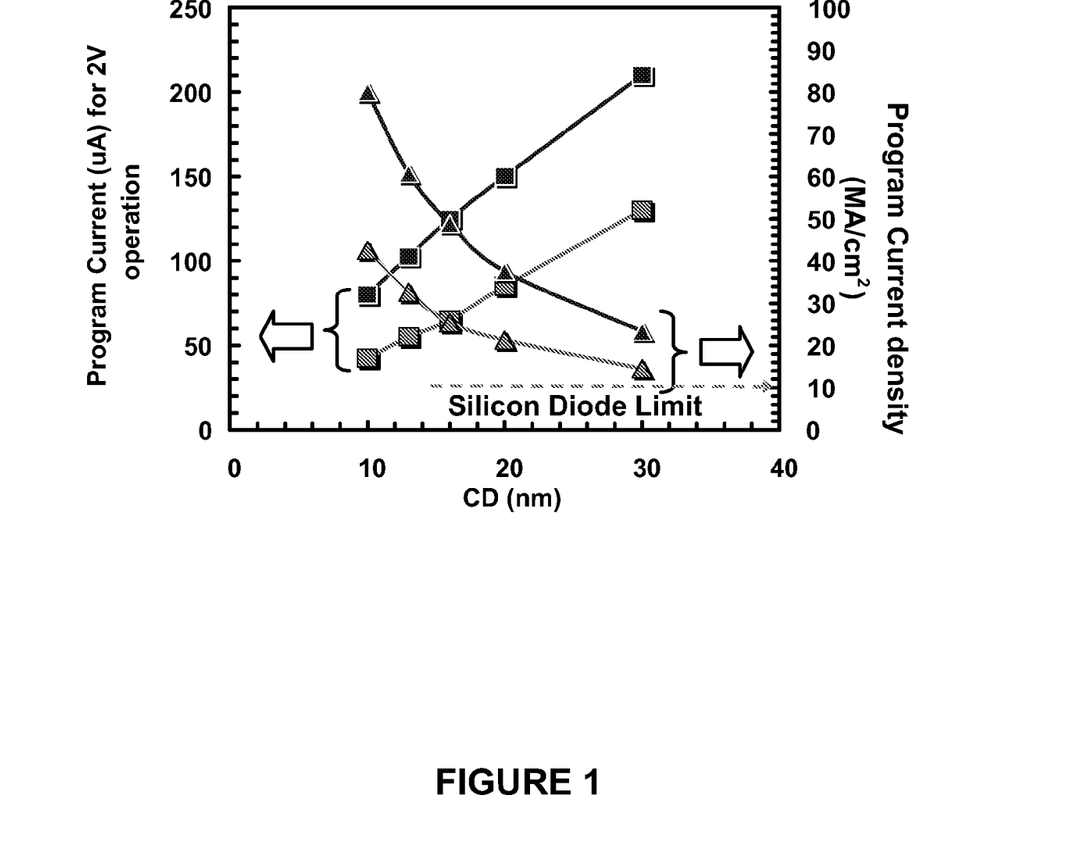
FIG. 1 illustrates the programming currents and current densities of typical resistive memory elements as a function of the critical dimension.

For most promising memory materials, programming current densities that are of the order of $10^7$-$10^8$ A/cm$^2$ are needed for critical dimensions (CDs) down in the range of 20-40 nm. FIG. 1 illustrates a graph of reset current and reset current density versus critical dimension for resistive memory elements that controllably change phase upon the passage of current. It can be seen from FIG. 1 that currents reduce with scaling but current densities increase substantially due to thermal losses that increase with scaling. Such studies illustrate that:

(a) as a memory element, PCMA requires high current densities to program; and (b) PCMA can supply high current densities when used as a diode.

In addition, for asymmetric programmable memory materials, such as SE, programming and erasing occur in opposite voltage polarities. Therefore, the diode needs to work in both directions (i.e., for both positive and negative applied biases) and needs to have an "OFF region", a threshold switch, followed by a low "ON resistance".

The best known single-crystal silicon p-n and Schottky diodes that can be used for rectification provide current densities not much higher than $10^6$ A/cm$^2$ at low voltages. This limit comes from a number of different factors including high level injection effects in p-n junctions, series resistance of doped region(s), etc. This is an order of magnitude smaller than what is needed for most resistive memory elements. In addition, the quality of the diodes that can be fabricated in middle-of-line (MOL) or back-of-end-the-line (BEOL) processes are typically much worse since they have to be made in amorphous or polycrystalline silicon that has much lower mobility. This prevents the use of p-n junctions in silicon or other materials as a rectifier for high-current memory elements (especially in 3D crossbar architectures).

In addition, the current through unselected cells has to be small to get adequate sense margins, prevent array-disturbs and reduce programming and read power. Typically a rectification ratio well in excess of 10 times the number of elements on the WL or BL is needed. In other words, for typical Mbit arrays, a rectification ratio of 10000 or above is needed (preferably exceeding $10^7$). The rectification ratio is typically a function of the bias since the leakage is typically a function of bias.

The prior art is silent with respect to solving any of the above-mentioned problems.

Since no conventional p-n junction in silicon and polycrystalline can supply enough current density for SE or other asymmetrically programmed memory materials, other nonlinear elements may be considered for use as diodes. For picking such a material, there are two important criteria:

(a) the ON state must have very high current densities; and (b) the OFF state must have a very high resistance; the ON/OFF ratio is preferably at least $10^6$ or so—so that reasonable crossbar array sizes may be enabled.

In one non-limiting example, the OFF state current density is less than 100 A/cm$^2$. In another non-limiting example, the OFF state current density should be less than 0.1 A/cm$^2$. More often than not, for array operation, it's the ON/OFF ratio that matters and an ON/OFF ratio exceeding $10^4$, and preferably exceeding $10^6$, is ideal.

As discussed earlier, PCMA can drive ultra high current densities and can be engineered to have very high OFF resistances. Therefore, the present invention discloses the use of phase change materials as a rectifier in a crossbar array.

Typical PCMA include doped and undoped versions of different chalcogenides including, but not limited to, $Ge_xSb_y$, $Ge_xSb_yTe_z$, $Ag_xIn_ySb_zTe_m$, etc. Preferred examples of such materials that can be used include N—Si or $Ta_2O_5$ doped $Ge_xSb_m$ and N/Si/SiO$_2$ doped $Ge_xSb_yTe_z$, wherein x, y, and z have numerical values ranging between 0 and 1.

Basic characteristics of PCMA include—

At low positive and negative biases, the PCMA remains OFF and has a very high resistance which is determined by the intrinsic resistivity of the amorphous PCMA. Most of the PCMA diodes in the crossbar array are in this state during standby operation.

At a certain threshold voltage (either positive or negative), the PCMA has a threshold switch and its resistance decreases dynamically by several orders of magnitude. This threshold voltage is a function of the material, structure, temperature, etc.

If the current passing through the device is high enough (i.e., $>I_{set}$), then a part of the structure turns crystalline. However, this effect is not desired in our case since the diodes in the crossbar array should mostly be non-conducting. If the current is limited by a series resistance (to less than the set current $-I_{set}$, or the voltage is limited), then the PCMA does not crystallize and remains in the high resistance state when the bias across the device is removed or reduced.

The present invention, therefore, provides: (1) an array architecture, (2) device structures, and (3) voltage sequences for using a PCMA for rectification of asymmetric programmable memory material, such as SE, or symmetric programmable memory element, such as PCM. The specification also addresses programming speeds, array organization, disturbs, endurance, etc., of a memory stack comprising a PCMA as the diode/rectifying element and a SE as the memory element. It should once again be noted that the preferred choice of the memory element is an asymmetric programmable memory element, such as SE.

Although specific examples of memory elements have been shown as examples, it should be noted that this concept can be extended to a host of memory node and rectifying elements.

Figure 2:
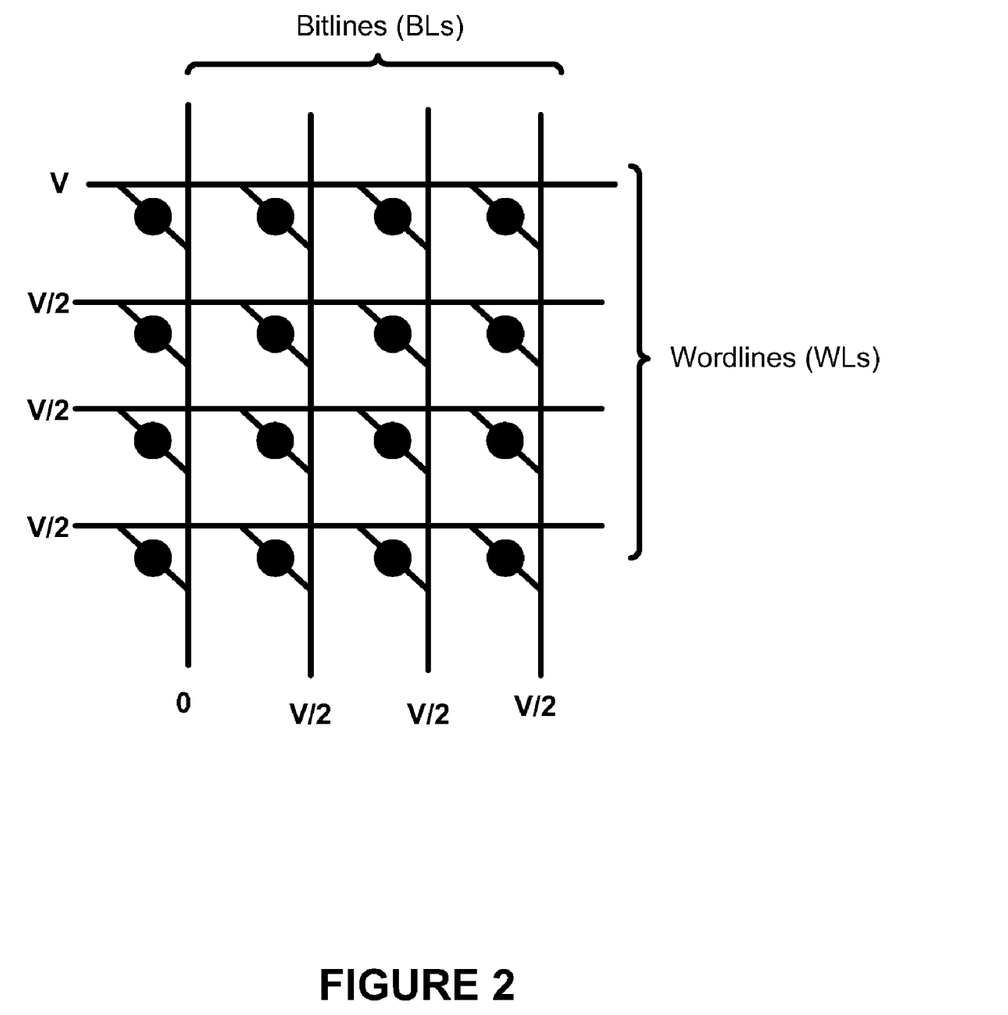
FIG. 2 illustrates a schematic plan view of one embodiment of the crossbar array in half-select mode (HSM) wherein the selected wordline (WL) is at V, the selected bitline (BL) is at 0V (Row 1 Column 1), and the unselected wordlines and bitlines are at V/2.

I. PCMA as a DIODE for Other Memories—Half-Select Mode (HSM) Architecture:

A rectifying element that turns on strongly at positive bias and switches off at negative bias would work in an HSM crosspoint architecture. FIG. 2 illustrates example voltages for an HSM crosspoint architecture for Program/Erase according to the teachings of the present invention. Each circular element in the figure represents a combination of a rectifying element (RE) and a memory element (ME). In an HSM architecture, the rectifying elements need to be shut off at half-select bias.

In one embodiment, as shown in FIG. 2, the selected WL is at V and the selected bitline(s) is at 0V (Row 1, Column 1 in FIG. 2). In FIG. 2, all unselected wordlines and bitlines are at V/2 volts. It should be noted that there are many possible choices of voltages (depending on the characteristics of the rectifier and the memory material). FIG. 2 merely illustrates one possible embodiment.

The unselected bitlines can be at any potential that will prevent the diodes at the intersection of rows (2,3,4) and columns (2,3,4) from turning on within the time required to typically program/read/erase the selected memory element.

The advantage of the above-described voltage scheme is that it minimizes the voltage on the half-selected memory elements. The wordline and bitline circuits are driven by wordline decoders and drivers and/or column selects and sense amplifiers. These circuits (not shown) and can be placed on the periphery of the array and/or below the array in a 3D circuit. The set of voltages that can be applied to the array are constrained by the turnoff potential of the rectifying element. This architecture is central to the rectifying element of the present invention.

An exemplary sequence for this example is:
All wordlines (WLs) and bitlines (BLs) are pulled from 0 to V/2.
Selected WL goes from 0 to V.
Selected BLs go from V to 0. This causes the memory array to look like the potentials shown in FIG. 2

The above-mentioned sequence causes the selected memory element to be programmed. It should be noted that a typical array operation may involve sequential programming of memory elements, which can involve a repeat of the above process for other elements in the array.

In an exemplary embodiment, the leakage current through each unselected element should satisfy the condition:

programming current or read current or erase current
$(I_{prog}$ or $I_{read}$ or $I_{erase}) \gg 2(M-1) \times I_{CE}(V/2)$ where $I_{CE}(V/2)$ is the crossbar element (Memory Element ME+Rectifying Element RE) current at V/2, which is cut off by the rectifying element.

Figure 3:
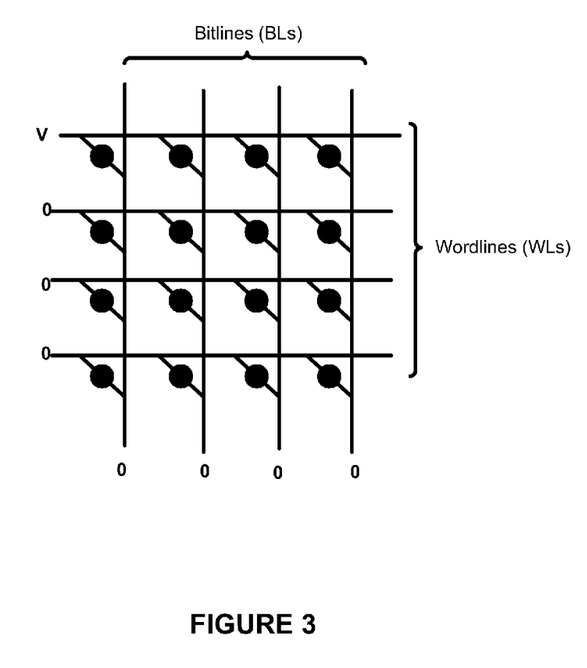
FIG. 3 illustrates an example of a half select memory (HSM) array during a read operation.

FIG. 3 illustrates an example of an HSM array during a read operation, where all elements of Row 1 are selected for a read operation. During an FSM Read, the selected WL is at V and the selected BLs (where data are read out) can be at 0V (unselected BLs, not shown in the Figure, can be at V or higher). The memory elements on the selected WL and BL=0V will cause bitline potentials to rise (if they have low resistance). The sense amplifiers detect the state of the cell, and consequently WL can be driven to 0 and all unselected BLs to 0V. It should be noted that V has to be chosen such that it is greater than $V_{th}$ and at the same time does not inadvertently program/erase the selected elements or the PCMA. In another example, all unselected bitlines could be kept at V/2.

It should be noted that FIGS. 2-3 and the associated descriptions are illustrative examples based on an ideal crossbar element that involves a diode element that does not program during the program/erase/read operation of the cell. This is not a necessary requirement.

Figure 4:
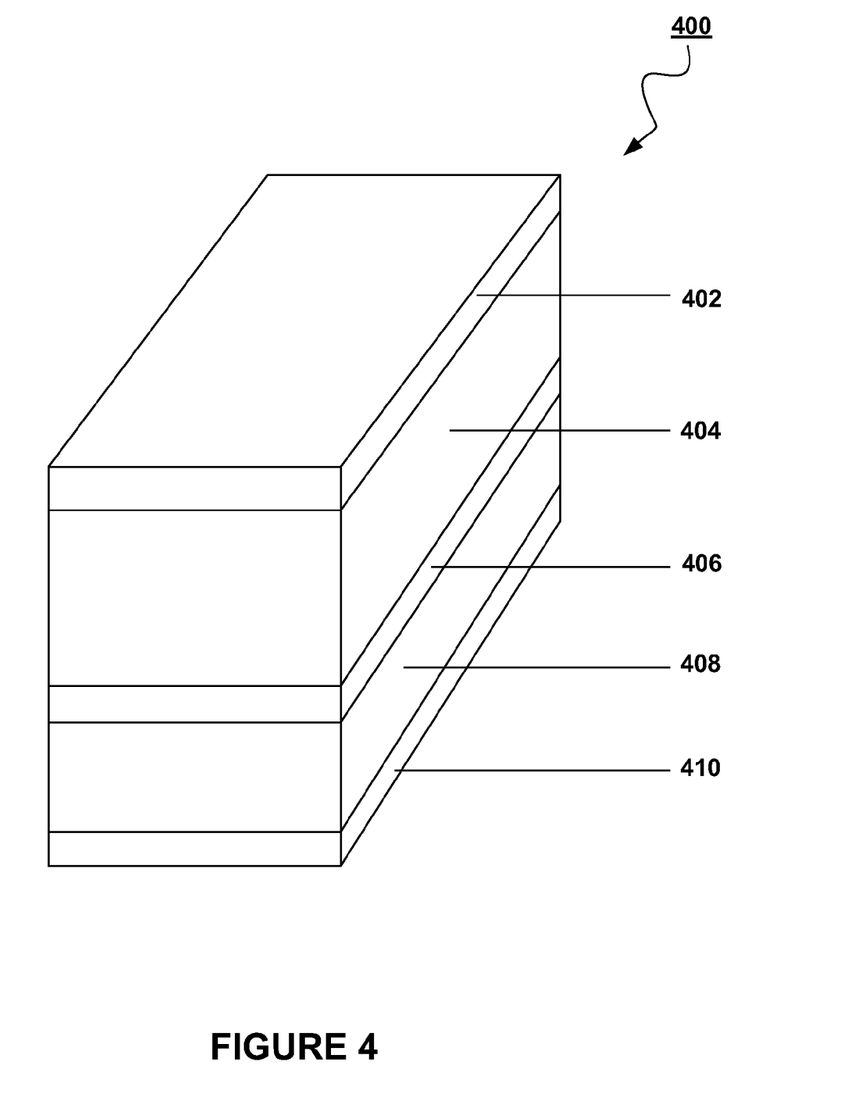
FIG. 4 illustrates a simplified crossbar element (CE) comprising a symmetric resistive memory (e.g., PCMA), as the diode, in series with an asymmetric programmable memory material, such as a solid electrolyte (SE) memory material, or a symmetric programmable memory material, such as phase change memory (PCM), wherein the crossbar element is sandwiched between a bitline and a wordline.

II. PCMA as a Diode for Symmetric Resistive Memories:

FIG. 4 illustrates a preferred embodiment 400 of the present invention, wherein a PCMA element 408 (examples of which were illustrated earlier) is in series with at least one memory element 404. Middle electrode 406 could be disposed between memory element 404 and PCMA element 408. Memory element 404 could be asymmetric programmable memory materials, such as solid electrolyte (SE) memories, or symmetric programmable memory materials, such as phase change memories (PCM). This series stack is placed between a top electrode 402 and a bottom electrode 410—which could be the 2 perpendicular lines that form a crossbar array. In the preferred embodiment, the memory element 404 is an asymmetric memory element such as SE. The dimensions of elements shown in FIG. 4 may be in the range of 5 nm to 500 nm.

In one embodiment, the present invention provides for a crosspoint architecture comprising: a plurality of electrodes; and a plurality of crossbar elements, each crossbar element disposed between a first and a second electrode in the plurality of electrodes, and wherein each crossbar element comprises at least a symmetric or substantially symmetric resistive memory material used as a rectifier in series with a memory element, and wherein the symmetric resistive memory material used as a rectifier, in an ON state, supplies an ultrahigh current density that is greater than $10^6$ A/cm$^2$.

In another embodiment, the present invention also provides for a crosspoint architecture comprising: a plurality of electrodes; and a plurality of crossbar elements, wherein each crossbar element is disposed between a first and a second electrode in the plurality of electrodes, and each crossbar element comprises at least a symmetric or substantially symmetric programmable material used as a rectifier in series with an asymmetric programmable memory node, said symmetric programmable material used as the rectifier, in an ON state, supplying an ultrahigh current density that is greater than $10^7$ A/cm$^2$.

In this scheme, additional elements (not shown) such as series resistors are also envisioned, wherein the resistors in series with PCMA element 408 and memory element 404 are used to "ease snapback". The series resistors could be made either in the memory material or in a reasonable resistance material like TiN or Ta—Si—N.

III. Basic Operation of PCMA and SE:

In order to illustrate how the SE memory can be "selectively" programmed/erased and read, the basic characteristics of the SE memory element are outlined below.

Figure 5:
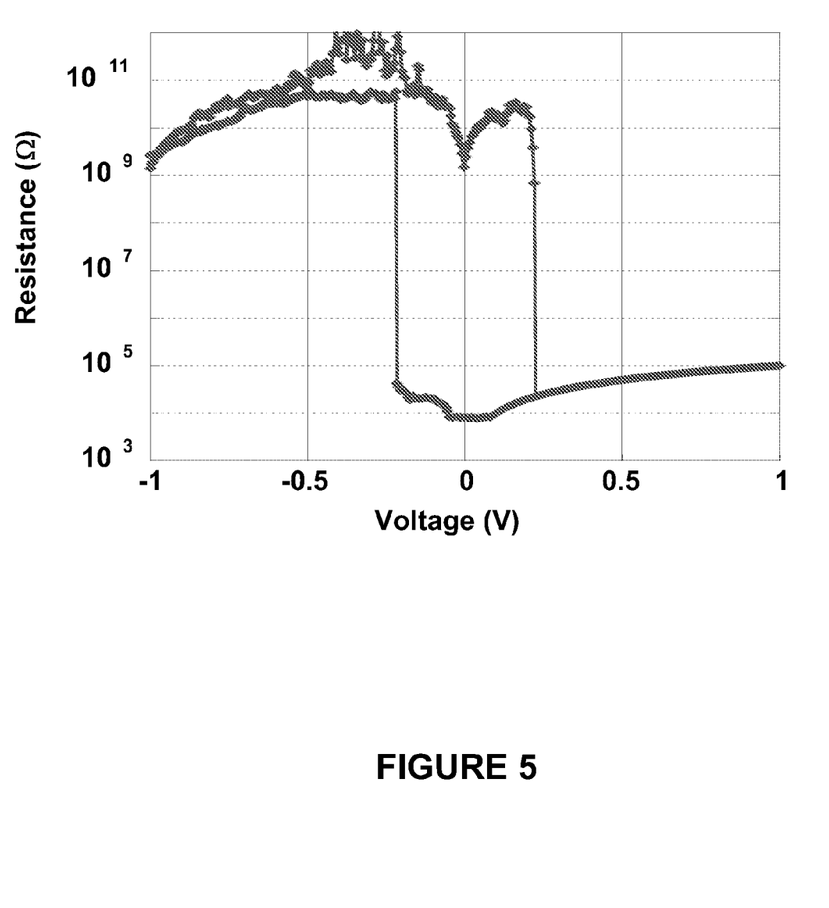
FIG. 5 illustrates a graph of the solid electrolyte (SE) resistance versus the voltage, from which it can be seen that the SE, on application of a positive voltage switches from high resistance to low resistance and, in application of a negative voltage switches from low resistance to high resistance.

FIG. 5 illustrates a graph of the SE resistance versus the voltage, from which it can be seen that the SE, on application of a positive voltage, programs to the low resistance state and, in application of a negative voltage, programs to the high resistance state. The two curves in FIG. 5 represent a forward sweep from −1.0 to 1.0 and a reverse sweep from 1.0 to −1.0, respectively. Let us assume that the SE is initially in the high resistance state, i.e., with no metallic filament that connects its two electrodes. In general, the solid electrolyte turns ON at a positive voltage $(V_A)$ and turns OFF at a negative voltage $(-V_B)$. $V_A$ and $V_B$ are a function of the material, temperature, measurement conditions, etc. When the SE turns ON, the ON resistance is typically a function of the program current $(R_{ON}=V_{th}/I_{PROG})$ where $V_{th}$ is the electro-deposition threshold. The OFF resistance is a function of the solid electrolyte material, the inert electrode, and other factors including temperature. $V_E$ is defined as the voltage at which the SE completely switches OFF for less than a specified time period $(T_E)$. $V_E$ is different from $V_B$ in the sense that $V_B$ is its DC equivalent. Also, $V_{EM}$ refers to the most negative $V_E$ that would guarantee a <50 ns turnoff speed for the entire array.

IV. Basic Parameters:

For the memory element (SE):
(a) Read Condition: $V_{read}$ (across SE)<0.2 V
(b) Program Condition (i.e., condition to put memory in the low resistance state): $V_{prog}$ (>0) and is typically >0.5V
(c) Erase Condition (i.e., condition to put memory in the high resistance state): $V_{erase}$ (<0) and is typically >0.5V For the diode material (PCMA):
The current is nonlinear with voltage. One particular example of this is a PCMA device with an abrupt turn-on voltage $(V_{th})$. The current in the On-state for the PCMA can be very high and would then be limited by the resistor and the ME.

With the stack shown in FIG. 4, it is possible to program/read and erase the SE element.

For reading the SE, the voltage across the SE has to be approximately 100 mV or so (and less than 500 mV). Therefore, across the series PCMA 408 and the SE stack 404, a total voltage $V_s=V_{pcma}+100$ mV could be applied. Since, $V_{pcma}$ can be engineered, either through film thickness or material composition or both, V will satisfy the condition necessary for FIG. 2 (i.e., V/2<Vth). Therefore, all half-selected and unselected memory elements stay off and have very little current passing through them. Across the selected element, the PCMA threshold switches and the excess voltage (~100 mV or so) drops across the SE. The voltage across SE 404 could be limited to a low value (necessary for read) either by appropriately choosing V or by having a series resistance that acts like a current/voltage limiter. If SE 404 is in the low-resistance state, the bitline will charge up to 100 mV or so, and if SE 404 is in the high-resistance state, the bitline will remain at ground. The sense amplifiers can then amplify the 100 mV or so signal to determine the data stored.

In order to program SE 404 (i.e., put it in the low-resistance state), a voltage of $V_{progse}$ (typically less than 2 V) is applied across SE 404. Therefore a total voltage $V_S = V_{pcma} + V_{progse}$ needs to be applied across the series stack. The series resistor, if present, limits the current in these devices so that the PCMA may not be inadvertently put in the set state. Similar to the read case, the half-select and unselected elements do not threshold switch if $V_S/2 \ll V_{th}$.

In order to erase SE 404 (i.e., put it in the high-resistance state), a voltage of $-V_{erase,se}$ is applied across SE 404. In this particular case, a total voltage, $V_R = -V_{erase,se} - V_{pcma}$ is applied. Typically, $V_{erase,se}$ is in the range of −0.5 to −1.0V mV. As in the read and program cases, $-V_{th}$ drops across the PCMA and $-V_{erase,se}$ drops across SE 404. The half-selected and unselected memory elements do not threshold switch if $V_{th} \gg -V_R/2$.

If the PCMA is programmed (Set) during any of the P/E/R operations, then the PCMA is reset by applying a suitable voltage pulse. This voltage has to be the same polarity as the program or erase pulse so that the process to reset the PCMA may not change the state of the memory element (SE). This is done typically by applying a high voltage pulse for a very short time (~10-100 ns).

The present invention, therefore, provides an architecture wherein PCMA is used as a rectifying element for a half-select crosspoint memory. Further, the present invention should not be limited to PCMA, as any material that has a sharp symmetric threshold switching point and very high ON/OFF ratio can be substituted. Further, the memory element can be any symmetric or asymmetric resistive memory element, however, in the preferred embodiment, an asymmetric element, such as SE, is used.

The present invention also teaches a crosspoint array comprising: a plurality of bitlines and wordlines; and a plurality of crossbar elements, each crossbar element disposed between a bitline and a wordline, and each crossbar element comprising at least a phase change material used as a rectifier in series with a solid electrolyte used as an asymmetric resistive memory element, where one or more of said crossbar elements are responsive to the following voltages: a first set of voltages to transition said phase change material in said crossbar elements from an OFF state to an ON state; a second set of voltages to read or program said solid electrolyte; and a third set of voltages to transition said phase change material from an ON state to a OFF state.

The present invention also provides a method for use with a crosspoint array, wherein the crosspoint array comprises a plurality of bitlines and wordlines and a plurality of crossbar elements, and each crossbar element is disposed between a bitline and a wordline, and each crossbar element comprises at least a phase change material used as a rectifier in series with a solid electrolyte. The method comprises the steps of: applying a first set of voltages to at least one of said crossbar elements, said first set of voltages transitioning said phase change material in said crossbar elements from an OFF state to an ON state; applying a second set of voltages to at least one of said crossbar elements, said second set of voltages reading or programming said solid electrolyte; and applying a third set of voltages to at least one of said crossbar elements, said third set of voltages transitioning said phase change material from an ON state to a OFF state.

CONCLUSION

A system and method have been shown in the above embodiments for the effective implementation of a symmetric resistive memory as a diode to drive a symmetric or asymmetric resistive memory. While various preferred embodiments have been shown and described, it will be understood that there is no intent to limit the invention by such disclosure, but rather, it is intended to cover all modifications falling within the spirit and scope of the invention, as defined in the appended claims. For example, the present invention should not be limited by specific voltage values at which bitlines and wordlines are driven by the illustrated structures.

The invention claimed is:

1. A crosspoint array comprising:
   a plurality of bitlines and wordlines; and
   a plurality of crossbar elements, each crossbar element disposed between a bitline and a wordline and each crossbar element comprising at least a phase change material used as a rectifier in series with a solid electrolyte used as an asymmetric resistive memory element, where one or more of said crossbar elements are responsive to the following voltages:
      a first set of voltages to transition said phase change material in said crossbar elements from an OFF state to an ON state;
      a second set of voltages to read or program said solid electrolyte, and
      a third set of voltages to transition said phase change material from an ON state to an OFF state.

2. The crosspoint array of claim 1, wherein said phase change material, in said ON state has a first resistance, $R_{ON}$, and in an OFF state has a second resistance, $R_{OFF}$, with $R_{OFF}/R_{ON} \geq 10^4$.

3. The crosspoint array of claim 1, wherein said solid electrolyte material includes at least one of the following: germanium sulfide ($Ge_xS_{1-x}$), germanium selenide ($Ge_xSe_{1-x}$), germanium telluride ($Ge_xTe_{1-x}$), silicon sulfide ($Si_xS_{1-x}$), silicon selenide ($Si_xSe_{1-x}$), silicon telluride ($Si_xTe_{1-x}$), arsenic sulfide ($As_xS_{1-x}$), arsenic selenide ($As_xSe_{1-x}$), arsenic telluride ($As_xTe_{1-x}$), lead sulfide ($Pb_xS_{1-x}$), lead selenide ($Pb_xSe_{1-x}$), lead telluride ($Pb_xTe_{1-x}$), cadmium sulfide ($Cd_xS_{1-x}$), cadmium selenide ($Cd_xSe_{1-x}$), cadmium telluride ($Cd_xTe_{1-x}$), zinc sulfide ($Zn_xS_{1-x}$), zinc selenide ($Zn_xSe_{1-x}$), zinc telluride ($Zn_xTe_{1-x}$), silver sulfide ($Ag_xS$), silver selenide ($Ag_xSe$), copper sulfide ($Cu_xS$), copper selenide ($Cu_xSe$), tungsten oxide ($WO_x$), copper oxide ($Cu_xO$), silver (Ag), copper (Cu), lithium (Li), sodium (Na), and zinc (Zn).

4. The crosspoint array of claim 1, wherein said crosspoint array is a three-dimensional array comprised of a plurality of layers, with wordlines and bitlines in each layer running at lithographic pitches, and the effective density of cells is $4F^2/n$, where 2F is a lithographic pitch and n is the number of layers.

5. The crosspoint array of claim 1, wherein said solid electrolyte material comprises germanium sulfide ($Ge_xS_{1-x}$) and copper (Cu).

6. The crosspoint array of claim 1, wherein said solid electrolyte material comprises germanium sulfide ($Ge_xS_{1-x}$) and silver (Ag).

7. A method for use with a crosspoint array, said crosspoint array comprising a plurality of bitlines and wordlines and a plurality of crossbar elements, each crossbar element disposed between a bitline and a wordline, each crossbar element comprising at least a phase change material used as a rectifier in series with a solid electrolyte, said method comprising the steps of:
   applying a first set of voltages to at least one of said crossbar elements, said first set of voltages transitioning said phase change material in said crossbar elements from an OFF state to an ON state;

applying a second set of voltages to at least one of said crossbar elements, said second set of voltages reading or programming said solid electrolyte, and applying a third set of voltages to at least one of said crossbar elements, said third set of voltages transitioning said phase change material from an ON state to an OFF state.

8. The method of claim 7, wherein said phase change material, in said ON state has a first resistance, $R_{ON}$, and in an OFF state has a second resistance, $R_{OFF}$, with $R_{OFF}/R_{ON} \geq 10^4$.

9. The method of claim 7, wherein said solid electrolyte material includes at least one of the following: germanium sulfide ($Ge_xS_{1-x}$), germanium selenide ($Ge_xSe_{1-x}$), germanium telluride ($Ge_xTe_{1-x}$), silicon sulfide ($Si_xS_{1-x}$), silicon selenide ($Si_xSe_{1-x}$), silicon telluride ($Si_xTe_{1-x}$), arsenic sulfide ($As_xS_{1-x}$), arsenic selenide ($As_xSe_{1-x}$), arsenic telluride ($As_xTe_{1-x}$), lead sulfide ($Pb_xS_{1-x}$), lead selenide ($Pb_xSe_{1-x}$), lead telluride ($Pb_xTe_{1-x}$), cadmium sulfide ($Cd_xS_{1-x}$), cadmium selenide ($Cd_xSe_{1-x}$), cadmium telluride ($Cd_xTe_{1-x}$), zinc sulfide ($Zn_xS_{1-x}$), zinc selenide ($Zn_xSe_{1-x}$), zinc telluride ($Zn_xTe_{1-x}$), silver sulfide ($Ag_xS$), silver selenide ($Ag_xSe$), copper sulfide ($Cu_xS$), copper selenide ($Cu_xSe$), tungsten oxide ($WO_x$), copper oxide ($Cu_xO$), silver (Ag), copper (Cu), lithium (Li), sodium (Na), and zinc (Zn).

10. The method of claim 7, wherein said crosspoint array is a three-dimensional array comprised of a plurality of layers, with wordlines and bitlines in each layer running at lithographic pitches, and the effective density of cells is $4F^2/n$, where 2F is a lithographic pitch and n is the number of layers.

11. The method of claim 7, wherein said solid electrolyte material comprises germanium sulfide ($Ge_xS_{1-x}$) and copper (Cu).

12. The method of claim 7, wherein said solid electrolyte material comprises germanium sulfide ($Ge_xS_{1-x}$) and silver (Ag).

13. A crosspoint array comprising:
a plurality of bitlines and wordlines; and
a plurality of crossbar elements, each crossbar element disposed between a bitline and a wordline and each crossbar element comprising at least a phase change material used as a rectifier in series with a solid electrolyte used as an asymmetric resistive memory element, said solid electrolyte material comprising either a combination of germanium sulfide ($Ge_xS_{1-x}$) and silver (Ag) or a combination of germanium sulfide ($Ge_xS_{1-x}$) and copper (Cu), and said phase change material, in said ON state has a first resistance, $R_{ON}$, and in an OFF state has a second resistance, $R_{OFF}$, with $R_{OFF}/R_{ON} \geq 10^4$, where one or more of said crossbar elements are responsive to the following voltages:
a first set of voltages to transition said phase change material in said crossbar elements from an OFF state to an ON state;
a second set of voltages to read or program said solid electrolyte, and
a third set of voltages to transition said phase change material from an ON state to an OFF state.

14. The crosspoint array of claim 13, wherein said crosspoint array is a three-dimensional array comprised of a plurality of layers, with wordlines and bitlines in each layer running at lithographic pitches, and the effective density of cells is $4F^2/n$, where 2F is a lithographic pitch and n is the number of layers.

15. The method of claim 1, wherein said solid electrolyte material comprises copper sulfide ($Cu_xS$).

16. The method of claim 1, wherein said solid electrolyte material comprises silver sulfide ($Ag_xS$).

17. The method of claim 7, wherein said solid electrolyte material comprises copper sulfide ($Cu_xS$).

18. The method of claim 7, wherein said solid electrolyte material comprises silver sulfide ($Ag_xS$).

* * * * *